United States Patent
Uzoh et al.

(10) Patent No.: US 8,692,118 B2
(45) Date of Patent: Apr. 8, 2014

(54) RELIABLE WIRE STRUCTURE AND METHOD

(75) Inventors: Cyprian Uzoh, San Jose, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 252 days.

(21) Appl. No.: 13/168,675

(22) Filed: Jun. 24, 2011

(65) Prior Publication Data
US 2012/0325517 A1    Dec. 27, 2012

(51) Int. Cl.
   *H01B 5/00*    (2006.01)
(52) U.S. Cl.
   USPC ....................................... 174/126.2
(58) Field of Classification Search
   USPC ............................. 174/94 R, 126.2
   See application file for complete search history.

(56) References Cited

U.S. PATENT DOCUMENTS

| | | | |
|---|---|---|---|
| 4,686,153 A * | 8/1987 | Tominaga et al. | 428/610 |
| 6,140,583 A * | 10/2000 | Suzuki et al. | 174/68.1 |
| 8,134,073 B2 * | 3/2012 | Wyland | 174/126.1 |
| 8,389,860 B2 * | 3/2013 | Uno et al. | 174/126.2 |
| 2009/0065907 A1 | 3/2009 | Haba et al. | |
| 2009/0120665 A1 | 5/2009 | Maki et al. | |
| 2009/0288856 A1 * | 11/2009 | Sandoval et al. | 174/126.2 |
| 2010/0171222 A1 | 7/2010 | Murai et al. | |
| 2010/0282495 A1 * | 11/2010 | Uno et al. | 174/126.2 |
| 2011/0147929 A1 | 6/2011 | Roy et al. | |

FOREIGN PATENT DOCUMENTS

WO    WO 2009/093554    *    7/2009

* cited by examiner

*Primary Examiner* — Chau Nguyen
(74) *Attorney, Agent, or Firm* — Haynes and Boone LLP

(57) ABSTRACT

A wire structure, which may be configured for a semiconductor device, is disclosed. The wire may include an elongate flexible core formed of a conductor material and a cladding layer covering an outer surface of the core. The cladding layer may be a conductor. In various aspects the cladding layer and core have a different grain sizes. An average grain size of the core material may several orders of magnitude greater than an average grain size of the cladding layer material. The cladding layer may be an alloy having a varying concentration of a minor component across its thickness. Methods of forming a wire structure are also disclosed.

7 Claims, 6 Drawing Sheets

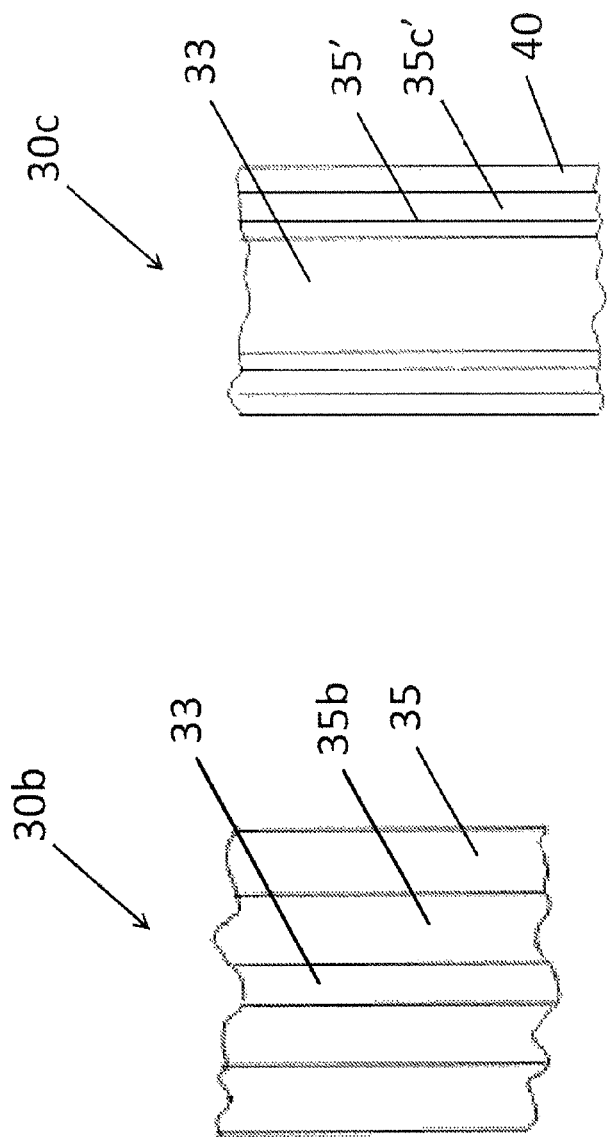

RELIABLE WIRE STRUCTURE AND METHOD

INCORPORATION BY REFERENCE

All publications, including patents and patent applications, mentioned in this specification are herein incorporated by reference in their entirety to the same extent as if each individual publication was specifically and individually indicated to be incorporated by reference.

FIELD OF THE INVENTION

The present invention relates generally to semiconductor devices and methods pertaining to their manufacture, and more particularly to an electrical wirebond.

BACKGROUND OF THE INVENTION

Semiconductor chips are fabricated on suitable flat substrate wafers, such as GaAs, diamond coated substrates, silicon carbide, and silicon wafers. After making the active devices, a series of steps are performed to connect the various devices with highly conducting wiring structures so they can have communication with each other to perform logic operations. These wiring structures or interconnect structures are essentially a skeletal network of conducting materials, typically metals in a matrix of dielectric materials. In high performance devices and to improve device density and yield, it is imperative to minimize topographic features and dimensions within the interconnect layers for any given device and across the entire substrate.

Wire drawing operations to fabricate wire bond materials reduce the grain size of the drawn wire. While the drawing operation typically increases the mechanical strength of the drawn wire, it also aligns the grains of the wire along the drawing direction. The alignment of the grains detrimentally increases the resistivity of the drawn material from its native value. A typical method to recover the resistivity of the drawn wire is to anneal it at a high temperature to enlarge the grains of the microstructure of the wire. However, the annealing process also weakens the material. The annealed wire can break easily by grain boundary sliding. Annealed wires tend to break at their mid span during wire bond operations. To improve the strength of the wire, the wire material is usually strengthened by the introduction of very small amount of dopants (e.g. Si and/or Be) into the structure of the wire. Excess dopants, however, may further harden the wire thus making it brittle. Thus, conventional wire structures often suffer for a lack of strength, decreased conductivity, or both.

There is also a continuing need to decrease the dimensions of wires, especially bonding wires. Conventional wires often include a metal filament for carrying the signal and an insulative plastic sheath encasing the filament to prevent electrical shorts. The sheath is usually flexible and slides over the filament to accommodate shearing as the wire is bent. In general, the strength of the wire structure is determined by the thickness of the filament. To that end, conventional wire structures typically have a relatively large diameter to meet the strength and reliability requirements. In many applications, the wire is thicker than necessary to carry the electrical signal in order to achieve the desired strength characteristics.

What is needed is a device and methods which overcome the above and other disadvantages of known wire structures.

SUMMARY OF THE DISCLOSURE

In summary, one aspect of the present invention is directed to a wire structure including an elongate flexible core formed of a conductor material; and a cladding layer covering an outer surface of the core, wherein the cladding layer comprises a conducting material.

In various embodiments, an average grain size of the core material is at least five times greater than an average grain size of the cladding layer material. An average grain size of the core material may be at least 20 times greater than an average grain size of the cladding layer material. The core may have an average grain size greater than 4000 nm, and the cladding layer may have an average grain size less than 4000 nm. The core may have an average grain size of greater than 1 micron. The cladding layer may have an average grain size between about 0.2 nm and about 4000 nm. The cladding layer may have an average grain size between about 2 nm and about 200 nm.

In various embodiments, the core has a diameter between about 15 micrometers and about 500 micrometers.

In various embodiments, the core is metal. The core may be a member selected from the group consisting of stainless steel, aluminum, gold, indium, gallium, tin, copper, tungsten, nickel, cobalt, molybdenum, and an alloy of the same. In various embodiments, the cladding layer is metal. The cladding layer may be a member selected from the group consisting of gold, indium, gallium, tin, copper-tungsten, nickel-tungsten, nickel-phosphorus, cobalt-phosphorus, molybdenum-phosphorus, cobalt-tungsten-phosphorus, and combinations of the same. In various embodiments, the cladding layer comprises a minor component selected from the group consisting of diamond, silicon carbide, boron nitride, and graphite. The minor component may be less than 50%, less than 25%, less than 10%, or less than 5% of the overall cladding layer composition. In various embodiments, the metal core is essentially free of dopants. In various embodiments, the cladding layer is essentially pure. In various embodiments, the cladding layer is essentially free of dopants. In various embodiments, the cladding layer and core are the same material.

In various embodiments, the cladding layer comprises an inner region and an outer region, the inner and outer regions comprising different material compositions. The inner region may be nickel with nano-scale grains, and the outer region may be nickel-tungsten with nano-scale grains.

In various embodiments, the cladding layer thickness is based on a diameter of the wire. In various embodiments, the cladding layer has an essentially uniform thickness. The cladding layer may have an average thickness between about 2 nm and about 200 nm.

In various embodiments, the cladding layer extends along essentially the entire length of the core. In various embodiments, the cladding layer covers essentially the entire outer surface of the core.

In various embodiments, the wire is a bonded interconnect. In various embodiments, the wire is configured for carrying a high frequency signal.

In various embodiments, the wire further includes additional other layers covering an outer surface of the cladding layer. The other layers may include an amorphous, conductive, nanograin material.

In various embodiments, the wire further includes an outer layer covering an outer surface of the cladding layer. The outer layer may be formed of a metal conductor having an average grain size at least five times greater than the average grain size of the cladding layer material. The outer layer and core may be substantially thicker than the cladding layer. The outer layer may be thicker than the core. In various embodiments, the cladding layer is formed of a nanograin material, and the outer layer and core are formed of micrograin materials.

Various aspects of the invention are directed to a wire including a filament formed of a conductor material; and a cladding layer covering an outer surface of the filament, the cladding layer being formed of a nanograin metal alloy composition.

In various embodiments, a concentration of a minor component of in the cladding layer composition is different interiorly of the cladding layer than along an outer surface. In various embodiments, the concentration of the minor component decreases moving from the outer surface towards an inner diameter of the cladding layer. In various embodiments, a concentration of a minor component of in the cladding layer composition varies across its thickness.

In various embodiments, an average grain size of the core material is significantly larger than an average grain size of the cladding layer material. In various embodiments, the cladding layer is selected and configured to provide environmental resistance.

Various aspects of the invention are directed to a device including any of the inventive features described above.

Various aspects of the invention are directed to a method of fabricating a wire including drawing a conductor material into an elongate wire filament; annealing the wire filament; and coating the wire with a conductive cladding layer. In various embodiments, the resulting cladding layer has an average grain size less than 4000 nm.

In various embodiments, the annealing includes heating a portion of the wire above an annealing temperature of the wire material. The coating may include attaching the cladding layer to at least a zone of the wire that has been heated. In various embodiments, the annealing includes heating the portion of the wire under sufficient conditions to increase an average grain size of the wire filament above at least 4000 nm.

In various embodiments, the annealing is performed under sufficient conditions to reduce the resistivity of the elongate wire by at least 10%.

In various embodiments, the coating includes contacting the wire with a metal solution comprising a metal dispersed in a solvent. The coating may include dipping the wire in the metal solution. The coating may include contacting the wire with a metal solution under sufficient conditions to grow metal particles on an outer surface of the wire. In various embodiments, the coating includes growing particles on an outer surface of the wire and stopping the growing based on a predetermined parameter. The predetermined parameter may be the average grain size of the resulting cladding layer.

In various embodiments, the method further includes applying a barrier material to an outer surface of the wire filament before the coating. A thickness of the resulting barrier layer may be less than a thickness of the resulting cladding layer.

In various embodiments, the method further includes applying a layer of metal over the wire filament before the coating.

In various embodiments, the method further includes strengthening the coated wire by applying a compressive stress to the cladding layer.

In various embodiments, the method further includes applying an insulative polymer coating over the resulting cladding layer.

In various embodiments, the method further includes thermosonic bonding the coated wire.

In various embodiments, the method further includes post-processing of the resulting wire.

The methods and devices of the present invention have other features and advantages which will be apparent from or are set forth in more detail in the accompanying drawings, which are incorporated in and form a part of this specification, and the following Detailed Description section.

BRIEF DESCRIPTION OF THE DRAWINGS

FIG. 3 illustrates the bonding wire of FIG. 1 including an optional, relatively thick second outer layer over the first cladding layer.

FIG. 4 illustrates the bonding wire of FIG. 1 including a plurality of optional outer layers and an insulating layer.

FIG. 7 is a view of the core material. FIG. 8 is a view of the outer cladding layer.

DETAILED DESCRIPTION

Figure 1:
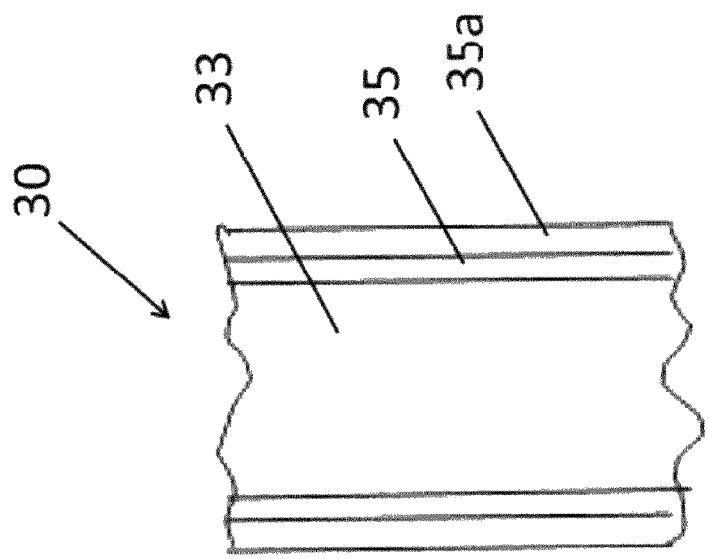
FIG. 1 illustrates a cross-section of an exemplary bonding wire in accordance with aspects of the invention, illustrating an outer cladding layer covering a wire core.

Reference will now be made in detail to exemplary embodiments of the invention, which are illustrated in the accompanying drawings. While the invention will be described in conjunction with the exemplary embodiments, it will be understood that they are not intended to limit the invention to those embodiments. On the contrary, the invention is intended to cover alternatives, modifications and equivalents, which may be included within the spirit and scope of the invention as defined by the appended claims.

For convenience in explanation and accurate definition in the appended claims, the terms "up" or "upper", "down" or "lower", "inside" and "outside" are used to describe features of the present invention with reference to the positions of such features as displayed in the figures. In many respects the embodiments of some figures resemble those of various other figures and similar reference numerals designate corresponding parts.

Unless expressly stated otherwise, the terms used herein are to be understood as used by one of ordinary skill in the art, and in various respects, the semiconductor and computer fields. Use of the singular in connection with the terms herein generally includes the plural and vice versa.

Various aspects of the invention generally relate to a metal or metal alloy wire for a bonding wire having high bonding reliability, high strength, and good electrical performance. Various aspects of the invention relate to the fabrication of metal conductive lines or wires that provide the interconnection of integrated circuits (IC) in semiconductor devices and/or the interconnections in a multi-layer substrate on which semiconductor device(s) are mounted. Various aspects of the invention relate to fabrication of bonding wires for use in a large-scale integration (LSI) chip, a micro-electro-mechanical (MEM) device, a memory device, and the like. Various aspects of the invention relate to a bonding wire suitable for bonding with IC chip electrodes such as outer leads of substrates used for semiconductor devices. Various aspects of the invention relate to a bonding wire used for in-vehicle devices and for high-speed semiconductor devices under a hot environment. Various aspects of the invention relate to the structure of bonding wire to be bonded with a metal or metal alloy. Examples of devices that may make use of the invention in certain aspects are described in U.S. Patent Pub. Nos. 2011/0147929A1 to Roy et al. and 2009/0065907A1 to Haba et al., the entire contents of which are incorporated herein for all purposes by reference.

FIG. 1 illustrates an exemplary wire structure, generally designated 30. The exemplary wire is a bonding wire for an integrated circuit. In various embodiments, the wire is configured for carrying a high frequency signal. Wire 30 includes a conducting core 33. The exemplary core is elongated. In various embodiments, the core is a thin filament. The core may be formed by conventional techniques such as drawing.

Various aspects of the invention relate to coating an annealed or unannealed filamentary material, for example a wire, with very thin layer or amorphous, conducting material. The exemplary conducting coating, referred to generally as a cladding layer 35, has a grain size in the nanometer dimension range (e.g. 1 nm to 100 nm). The exemplary cladding layer may suppress grain boundary sliding. The cladding layer may increase the mechanical strength of the coated wire material 30, increase the corrosion protection, and/or suppress oxygen degradation of the filamentary material.

Cladding layer 35 may include internal stresses. The stress in cladding layer 35 may be tensile or compressive in nature. In some applications, a compressive stress in the cladding layer or layers may be desirable. For example, designing stress into the cladding layer may achieve desired physical characteristics.

Exemplary wire 30 includes a cladding layer 35 over an outer surface of core 33. Cladding 35 may be continuous, conformal, or both. The coated material may be discontinuous. Cladding layer 35 may cover all or only a portion of core 33. For example, the coating material may selectively coat or have thicker deposits around defects or grain boundaries of the core surface. The cladding layer may cover only a portion of the core along its length. The cladding layer may cover only a circumferential portion of the core.

Cladding layer 35 may be formed by coating an alloy material over the core using electroless techniques, electrolytic techniques, kinetic metallization, or combinations of the same. Other techniques may be used as will be described below and as understood by one of skill from the description herein.

The cladding layer may be configured to maintain, or enhance, the conduction characteristics of the overall wire structure. In various embodiments, cladding layer 35 is configured to avoid substantially interfering with the conductivity of core 33. In various embodiments, the resulting structure 30 including the cladding layer 35 and core 33 has a resistivity within 5% of the native core alone. In various embodiments, the cladding layer changes the resistivity by less than about 10%. In various embodiments, the cladding layer does not change the resistivity of the core. In various embodiments, the cladding layer increases the conductivity of the core.

In various embodiments, the cladding layer is configured to increase the strength of the wire. In various embodiments, the cladding layer increases the strength of the core between about 10% and about 20%. In various embodiments, the cladding layer increases the strength of the core by more than about 5%, more than about 10%, or more than about 20%. As used herein, "strength" refers to tensile strength and/or yield point. In various aspects, it is believed that the nano-scale grains of the cladding layer fill in the relatively larger gaps between grains in a surface of the core thereby increasing the overall strength of the wire.

The ability of exemplary cladding layer 35 to increase the physical strength of core 33 while essentially maintaining conductivity is one distinguishing feature of the novel wire structure. Conventional processes for fabricating wire structures suffer from a trade-off of strength for conductivity and performance. In part, drawing usually increases the strength of the wire material while undesirably causing a commensurate increase in resistivity. Conventional wire structures are annealed at high temperatures to enlarge the grains of the microstructure thereby recovering the wire conductivity. However, the annealing process generally decreases the strength of the material. The above trade-off presents an increasing problem as semiconductor devices become smaller and demand higher performance wire structures. Conventional wire filaments lack the necessary reliability and strength at the scale of many present semiconductor devices.

Exemplary cladding layer 35 is a nanograin material. As used herein, "nanograin" generally refers to a material or structure having an average grain size on the scale of nanometers, and in various respects, less than 1000 nm or less than 100 nm. In various respects, "nanograin" refers to materials and structures sized between about 1 nm to about 1000 nm in at least one dimension. In various respects, "nanograin" and "nanoscale" are used somewhat interchangeably.

In various embodiments, core 33 has an average grain size of greater than 4000 nm. In various embodiments, the core has an average grain size of greater than 5000 nm, greater than 7500 nm, greater than 10000 nm, greater than 20000 nm, greater than 1 micrometer, or greater than 5 micrometer. In various embodiments, cladding layer 35 has an average grain size of less than 4000 nm. In various embodiments, the average grain size of wire core 33 is at least two times the average grain size of cladding layer 35. The average grain size of the core may be more than 5, more than 10, more than 20, more than 100, or more than 1000 times the average grain size of the cladding layer.

In various respects, "grain size" refers to a major dimension of the grain. Many of the processes described result in materials with non-spherical grains. For example, the drawing process typically elongates the grains into a filament shape. Typically the length of the grain is about three to about four times the width of the grain. In this exemplary case, "grain size" refers to the long dimension or length.

In various embodiments, cladding layer 35 has an average grain size between about 0.2 nm and about 4000 nm. In various embodiments, the cladding layer has an average grain size of less than 3000 nm, less than 2000 nm, less than 1000 nm, less than 500 nm, less than 100 nm, or less than 10 nm. In various embodiments, the cladding layer has an average grain size between about 0 nm to about 4000 nm, about 2 nm to about 4000 nm, about 1 nm to about 200 nm, about 2 nm and about 200 nm, about 1 nm to about 500 nm, or about 1 nm to about 100 nm. In various embodiments, core 33 has an average grain size between about 15 micrometer and about 500 micrometer. In various embodiments, the grains of the cladding layer are on the order of nano-scale and the grains of the core are on the order of micro-scale.

Suitable materials for core 33 include, but are not limited to, gold, copper, aluminum, stainless steel, indium, gallium, tin, tungsten, nickel, cobalt, molybdenum, any of the transition metals, and alloys of the same. Suitable alloys include, but are not limited to, copper-tungsten, nickel-tungsten, nickel-phosphorus, cobalt-phosphorus, molybdenum-phosphorus, cobalt-tungsten-phosphorus, and combinations of the same. In various embodiments, the core is essentially pure. In various embodiments, the core is essentially free of dopants. One will appreciate, however, that the level of dopants may depend on the application. Increasing the concentration of dopants generally increases the stiffness of the structure. In the case of bonding wire, it is generally desirable to maintain a degree of flexibility. In various embodiments, the concentration of dopants and/or impurities in the core is 2.5% or less. The composition of the core may vary depending on the application and business factors (e.g. cost of materials and manufacturability). In an exemplary embodiment, the core is formed of an alloy material. The amount of alloying element in the material may vary by 15% in some cases. In one example, the core includes a tungsten alloy and the tungsten alloy varies from between about 5% to about 30%. Various aspects of the core may be similar to the devices described in U.S. Patent Pub. Nos. 2009/0120665 to Maki et al. and 2010/0171222 to Murai et al., the entire contents of which are incorporated herein for all purposes.

With reference to FIGS. 1-4, exemplary embodiment cladding layer 35 is configured to be a conductor. In various embodiments, the cladding layer is formed of a metal conductor. Suitable materials for cladding layer 35 include, but are not limited to, gold, copper, aluminum, stainless steel, indium, gallium, tin, tungsten, nickel, cobalt, molybdenum, any of the transition metals, and alloys of the same. Suitable alloys include, but are not limited to, copper-tungsten, nickel-tungsten, nickel-phosphorus, cobalt-phosphorus, molybdenum-phosphorus, cobalt-tungsten-phosphorus, and combinations of the same. It is well known that copper tends to corrode easily in the presence of oxygen. For this reason, it may be desirable to select a copper alloy in place of pure copper. In various embodiments, the cladding layer includes a minor component or particulate selected from the group consisting of diamond, silicon carbide, boron nitride (cubic or hexagonal), and graphite. In various embodiments, the particulate comprises less than 50% of the cladding layer composition. In various embodiments, the volume content of the incorporated very fine particulates is sufficiently small so the integrity of the joint or bond interface after the thermosonic bonding is not adversely affected.

In various embodiments, the wire structure includes two or more cladding layers and one of the cladding layers is non-conducting. For example, the wire structure may include an outer cladding layer that electrically insulates the wire. In some high specialized applications, inner core 33 may be a stainless steel wire or tungsten wire. The wire may be coated with a barrier clad layer, for example NiW. The barrier layer may be coated with a much thicker, highly conductive material such as copper. The thick copper layer may be coated with one or more layers of alloyed or unalloyed material with nano-scale grain size copper film prior to subsequent processing.

The cladding layer may include an inner region having a different material composition than an outer region. For example, an inner region of the cladding layer may be nickel and an outer region may be nickel-tungsten. The composition of tungsten may gradually decrease moving from the outer region inward towards the core. In various embodiments, the cladding layer is formed of different constituent materials. In various embodiments, the cladding layer is essentially pure.

In various embodiments, one of the core and the cladding layer is formed of a metal and the other is formed of an alloy of the metal. One will appreciate from the description herein that the core and the cladding layer may be formed of similar materials.

Cladding layer 35 may be of the same material as the native wire material of core 33. In various embodiments, core 33 and cladding layer 35 are formed of the same material but have different average grain sizes.

Figure 2:
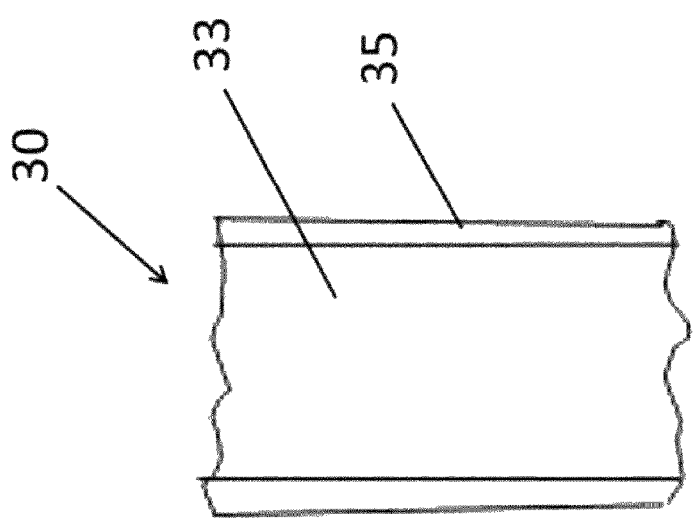
FIG. 2 illustrates the bonding wire of FIG. 1 including an optional second outer layer over the first cladding layer.
Figures 5, 6:
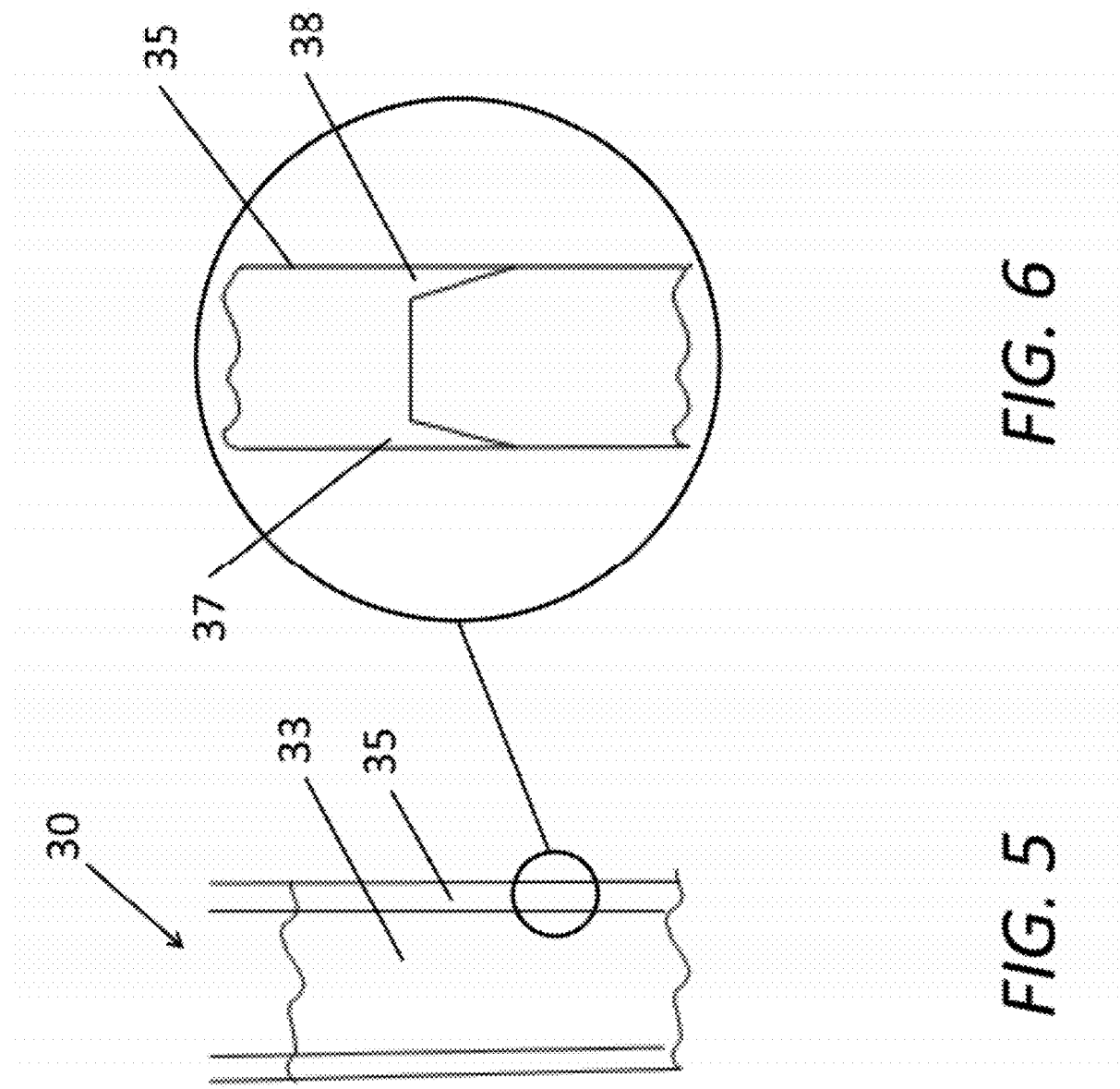
FIG. 5 is illustrates an exemplary bonding wire similar to that of FIG. 1.
FIG. 6 is a schematic illustrating how the concentration of an alloying element varies across the wire thickness.

Attention is now directed generally to FIGS. 2-4. In various embodiments, more than one cladding layer is applied to the surface of the native wire. For alloy cladding layer or layers, the composition profile of the minor element or elements may be varied, for example, to optimize wire bonding properties. In various embodiments, the composition of the minor element in the interior of cladding layer 35 is lower than near an inner diameter 37 and outer surface 38 (shown, e.g., FIG. 6). In various embodiments, the composition of the minor element in the inner diameter 37 of cladding layer 35 is lower than the composition at the surface or close to the outer surface 38. One will appreciate that the concentration and type of the minor component or components may vary depending on the application.

In an exemplary embodiment, the outer surface of the cladding has a composition selected to be harder than the inner diameter. As a result, the outer surface provides better abrasion and handling resistance. In an exemplary embodiment, the cladding layer comprises an inner shell of Ni layer with nano-scale grains and an outer shell of NiW with nano-scale grains, or vice versa. In an exemplary embodiment, the outer surface of the cladding has a composition selected to provide environmental resistance. The composition profile of the minor component or components of the alloy may be varied as desired. For example, the minor component may comprise from 0 to about 49% of the cladding layer composition.

FIGS. 2 and 3 illustrate exemplary wires 30 with additional cladding layers over wire core 33. When more than one cladding layer is used, the thickness of the different cladding layers may be similar or different. In practice, the thickness of the exemplary cladding layer may be designed or selected in a manner such that the cladding structure does not impair the desired properties of the bond joint.

In various embodiments, the thickness of the cladding layer may be based on the dimensions of the core. For example, the cladding layer thickness may be selected to impart a desired increase in strength. In various embodiments, cladding layer or layers 35 comprise up to about 15% of the total diameter of wire 30. In various embodiments, the thickness of the cladding layer is less than about 0.1% of the total thickness of the wire. The thickness of cladding layer 35 may vary between about 0.1 nm to about 4000 nm, between about 0.2 nm to about 4000 nm, between about 0.2 nm to about 1000 nm, between about 0.2 nm to about 500 nm, between about 0.2 nm to about 200 nm, and between about 2 nm and about 200 nm. One will appreciate that the cladding layer thickness may be as thin as a single grain width.

The thickness of the cladding layer may be essentially uniform around a circumference of the wire and/or along its length. The thickness of the cladding layer may vary. For example, it may be desirable to increase the thickness of the cladding layer in heat affected zones (HAZ).

In practice, the core diameter may vary along its length. Conventional wires typically have a minimum diameter of at least 30 micrometer. Because the wire in accordance with aspects of the invention does not need to be thick for strength, the wire core diameter may be significantly decreased without risk of failure and reliability concerns. In various embodiments, the wire core has a diameter of less than 5 micrometer. In various embodiments, the wire core has a diameter of less than 1 micrometer. One of skill in the art will appreciate that a 1 micrometer metal wire may be sufficient to carry a current signal typical of present semiconductor devices.

The wire structure may make use of one or more types of cladding material. FIG. 2 illustrates an exemplary wire 30a generally formed by coating wire 30 of FIG. 1 with additional cladding layer(s). In an exemplary embodiment, a gold (Au) wire core 33 is coated with a nanograin gold (nAu) cladding layer 35 (as shown, e.g., FIG. 1). In an exemplary embodiment, a copper wire core 33 is coated with a nanograin copper (nCu—Cu) cladding layer 35.

The wire is then optionally coated with another cladding layer 35a. In some cases cladding layer 35a is referred to as the alloy layer. In an exemplary embodiment, alloy layer 35a is a very thin layer of nickel-tungsten (NiW). The alloy layer defines an outer layer covering an outer surface of the cladding layer. FIG. 2 illustrates the resulting exemplary wire structure 30a having the form NiW-nCu—Cu or NiW-nAu—Au. The resulting wire has high strength and increased corrosion protection for improved wire looping and handling.

FIG. 3 illustrates another wire 30b similar to wire 30a except the layers are essentially reversed. Wire 30b include an alloy layer 35b over the wire core 33. A nanograin cladding layer 35 is applied over alloy layer 35b. In various embodiments, cladding layer 35 is a nanograin pure metal or relatively pure metal.

In various embodiments, the alloy layer is significantly thicker than the nanograin cladding layer. In an exemplary embodiment, the alloy layer is as thick, or thicker, than the wire core. By comparison, the nanograin cladding layer is significantly thinner. In various embodiments, the alloy layer is at least five times thicker than the nanograin cladding layer. The alloy layer may be more than 100 or more than 1000 times thicker than the cladding layer.

In various embodiments, the alloy layer has an average grain size at least five times greater than an average grain size of the cladding layer. The alloy layer grain size may be more 100 or more than 1000 times greater than an average grain size of the cladding layer. In various embodiments, alloy layer 35b and core 33 have micrometer-sized grain structure and cladding layer 35 has a nanometer-sized grain structure. In various embodiments, the cladding layer has a density significantly greater than a density of the core. In various embodiments, the cladding layer has a density significantly greater than a density of the alloy layer.

One will appreciate from the description herein that the number and type of layers applied to the wire core may vary depending on the application. In some applications, more than one type of unalloyed metal is coated on the native wire. The first unalloyed layer and the second unalloyed layer may be of the same material but exhibit different properties. For example, the layers may have different grain size, texture, hardness, electrical resistivity, etc.

In various embodiments, different cladding layers formed of unalloyed materials are coated over each other. For example, a copper wire may be coated with a nanograin copper cladding layer and the cladding layer coated with an indium cladding layer, or vice versa. The multi-layered unalloyed cladding structure may also be coated with one or more alloy layers. The alloy layers may be nanograin layers.

More than one alloy material may be used to coat the native wire core 33. For the example, the layers may consist of very thin layer of CoP/NiP, CoP/NiW, CoWP/NiW, or NiW/MoW. The layer may be deposited from one or more plating baths. The thickness of the layers may be designed or proportioned based on the wire diameter or joint volume, such that after wire bond, the alloying clad material does not adversely affect the electrical performance of the bond or joint.

The coated core 33 may serve to carry large currents or currents at very high frequencies. For example, the core may be a wire filament formed of stainless steel, tungsten, or molybdenum (Mo). The wire filament, in turn, may be coated with a significantly thicker layer of nanograin copper, such as by electrolyitc methods. The wire may be treated using conventional techniques to adjust the wire properties. For example, the coated filament may be annealed at high temperatures to reduce the resistivity of the wire.

In various embodiments, a thin layer of adhering or barrier material, such as NiW alloy material, is applied to the outer surface of the native wire core before applying the cladding layers. The major conducting medium may be coated with a flash layer of alloy material to protect it from the environment or from damage by subsequent manufacturing processes, for example, application of an insulative coating (shown, e.g., FIG. 4).

FIG. 4 illustrates a wire structure 30c in accordance with various aspects of the invention. Wire structure 30c is similar in many respects to wire structure 30a except wire structure 30c includes an outer polymer cladding layer 40. Wire structure 30c includes a wire core 33 covered with a first cladding layer 35' and second cladding layer 35c'. Exemplary first cladding layer 35' is an essentially pure, non-alloyed metal having a nanograin structure. Exemplary second cladding layer 35c' is an essentially pure, non-alloyed metal having a relatively large grain structure. In an exemplary embodiment, the first cladding layer is formed of nanograin copper (nCu) and the second cladding layer is formed of indium (In). Polymer cladding layer 40 is applied over the outer surface of the second cladding layer for electrical and/or environmental protection. For example, the polymer cladding may prevent the wire from shorting if it touches another wire bond structure in the substrate.

Polymer layer 40 ablates from the surface of the wire at the portion of the wire close to the tip and at the tip of the wire from the heat of the thermosonic bonding process. During the thermosonic bonding process, portions of the exemplary cladding material may admix with the material of the bond pad. This may further improve the desirable properties of the bond and/or joint.

Exemplary methods of forming a reliable wire structure in accordance with aspects of the invention will now be described.

The wire core may be formed of Group 11 filamentary material by drawing material through dies in a conventional manner. Group numbers refer to the International Union of Pure and Applied Chemistry (IUPAC) numbering system. In some exemplary embodiments, the core material is copper and the drawn filament has a diameter between about 0.5 microns to about 1000 microns, and in some embodiments about 2 microns to about 100 microns.

Next, the wire material is optionally annealed by known methods to reduce the resistivity of the drawn wire.

Thereafter, the wire is coated with an alloy of a material from Group 10 and Group 6, Group 11 and Group 10, Group 10 and Group 15, or their various combinations. The annealed or partially annealed exemplary wire may be coated with an alloy of NiW by electrochemical methods. As an example, the NiW may be coated by dipping the wire in a electrodeposition plating bath.

An exemplary bath includes a source of Group 10 material (e.g. nickel) and a source of Group 6 material (e.g. tungsten). The nickel ion source may be known soluble salts of nickel including, but not limited to, a sulfate, a chloride, a nitrate, a sulfamate, a citrate, and a nickel amine salt. The tungsten ion source may include known soluble salts of tungsten including, but not limited to, tungsten chloride, sodium tungstate, tungstosilicic, and acid hydrate. The bath may include a complexing agent, a conductivity agent, a pH adjusting agent, a pH buffer agent, a wetting agent, a chloride or bromide source to enhance electrode polarization, a solvent such as water, and combinations of the same. The exemplary nickel concentration of the bath may range between about 0.01M and about 0.4M, and in some embodiment is between about 0.03M and about 0.2M. The tungsten ion content may vary between about 0.03M to about 0.3M, and in some embodiments is between about 0.05M and about 0.2M. The exemplary complexing agent is water soluble and includes one or more multi-carboxylate or amine groups and may be selected from organic compounds such as tartaric acid, malic acid, citric acid, citrates, gluconates, ethylene diamine, ethylenediaminetetraacetic acid, salts of alkali metals, or ammonium ions with an organic acid, such as sodium citrates and ammonium citrate. The bath content of the chelating agent may vary between about 0.05M and about 0.6M, and in some embodiments is between about 0.1 and about 0.4M. In general, the higher the concentration of the complexing agent the lower the deposition rate. The bath may include other additives such as an aid to improve bath conductivity, which may include sodium chloride, sodium bromide, ammonium sulfate, sodium sulfate, and the like. The bath content of the conductivity process aid may be as high as about 0.5M, or higher.

The temperature of the plating bath during the exemplary plating operation may be between room temperature and about 90 degrees Celsius, and in some embodiments is about 40 degrees to about 80 degrees. The elevated temperature may enhance mass transport.

Figure 9:
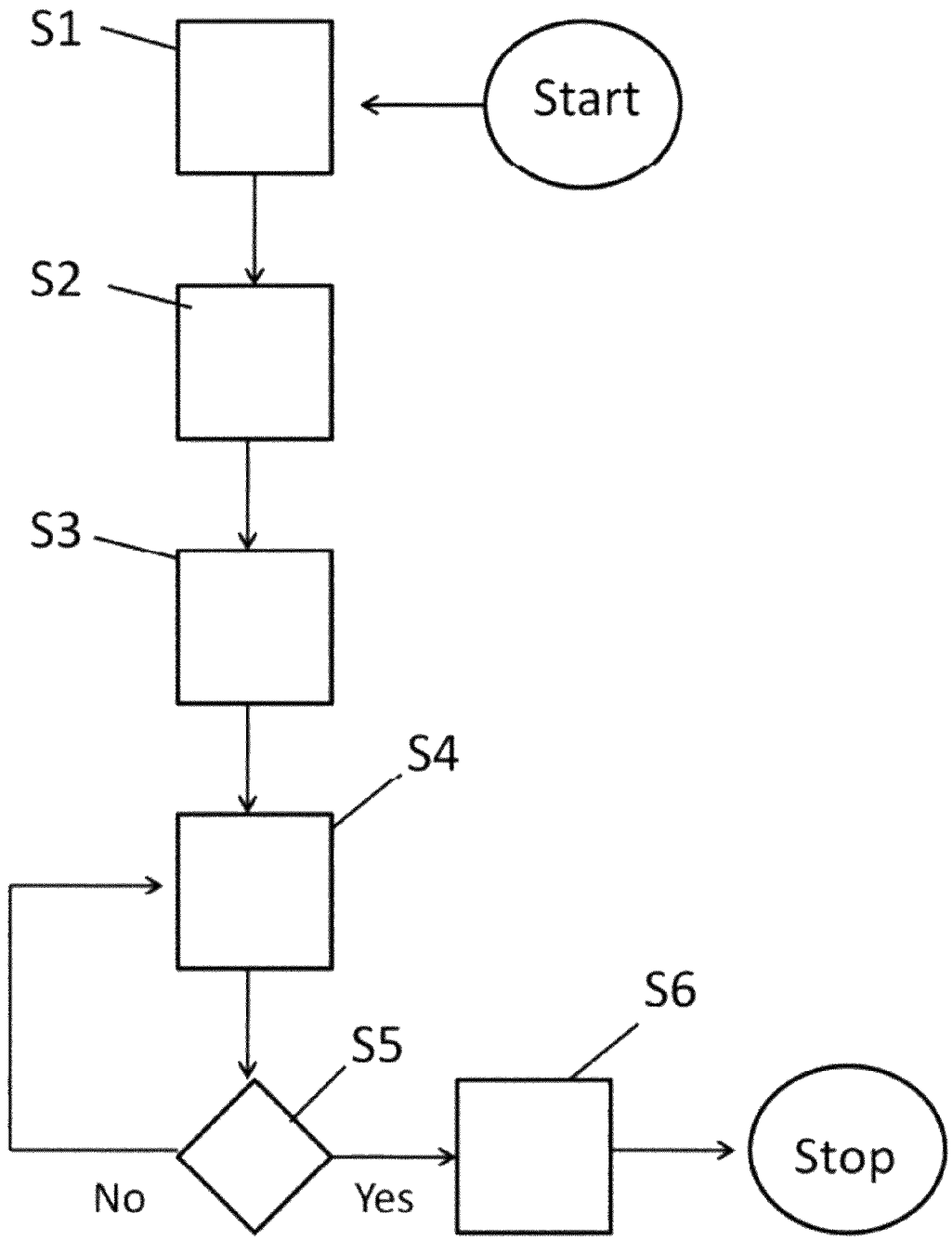
FIG. 9 is a flowchart of an exemplary method for fabricating a wire structure in accordance with aspects of the invention.

Turning to FIG. 9, an exemplary method of fabricating the wire structure using the above plating process will now be described. In step S1, a metal is drawn into a filament defining the wire core.

In optional step S2, the drawn wire is coated with a barrier material in preparation for step S3. The barrier layer is applied over an outer surface of the wire core before coating with a cladding layer. The resulting barrier layer is relatively thin. In some cases, the barrier layer is thinner than the cladding layer. One will appreciate that barrier layers may be used at various stages in the process as desired.

Optional step S3 involves coating the wire with an alloy cladding layer. The alloy cladding layer is prepared as discussed above with reference to FIGS. 3 and 4.

Next, in step S4 the alloy-coated wire is dipped in the plating bath under sufficient conditions such that metal particles from the bath grow on the wire core surfaces. Unlike the alloy cladding layer applied in step S3, the cladding layer applied in step S4 has a nano-scale grain structure.

In step S5, a user or computer waits for a predetermined parameter to stop the growing process of step S4. Once the predetermined parameter is received, the growing process stops immediately at step S6. The predetermined parameter may be a desired average grain size or other characteristic of the resulting cladding layer. The process may be configured such that the process stops at a predetermined time corresponding to a known time to obtain a desired material characteristic or the like. The growing process may be stopped by removing the wire structure from the plating bath. In an exemplary case, the desired cladding layer has a small grain size and thus the plating process proceeds very quickly. Thus, it may be desirable to use methods to stop the plating process more quickly and precisely. Such methods may include, but are not limited to, adding an agent to stop to process or changing the plating conditions (e.g. changing a voltage).

The current density of the cladding material may vary between about 5 mA/sq.-cm to about 200 mA/sq.-cm, and in some embodiments is between about 10 mA/sq.-cm to about 100 mA/sq.cm. The plating may be carried out under constant current or constant voltage with DC. The plating may be carried with pulse DC with or without current. Voltage reversal may also be employed when necessary. In constant current plating conditions, depending on the specific plating bath formulation, the higher the plating current density the higher the tungsten content of the NiW, in general.

Aspects of the invention are further illustrated by the Examples that follow. The Examples are not intended to define or limit the scope of the invention.

EXAMPLES

Figure 7:
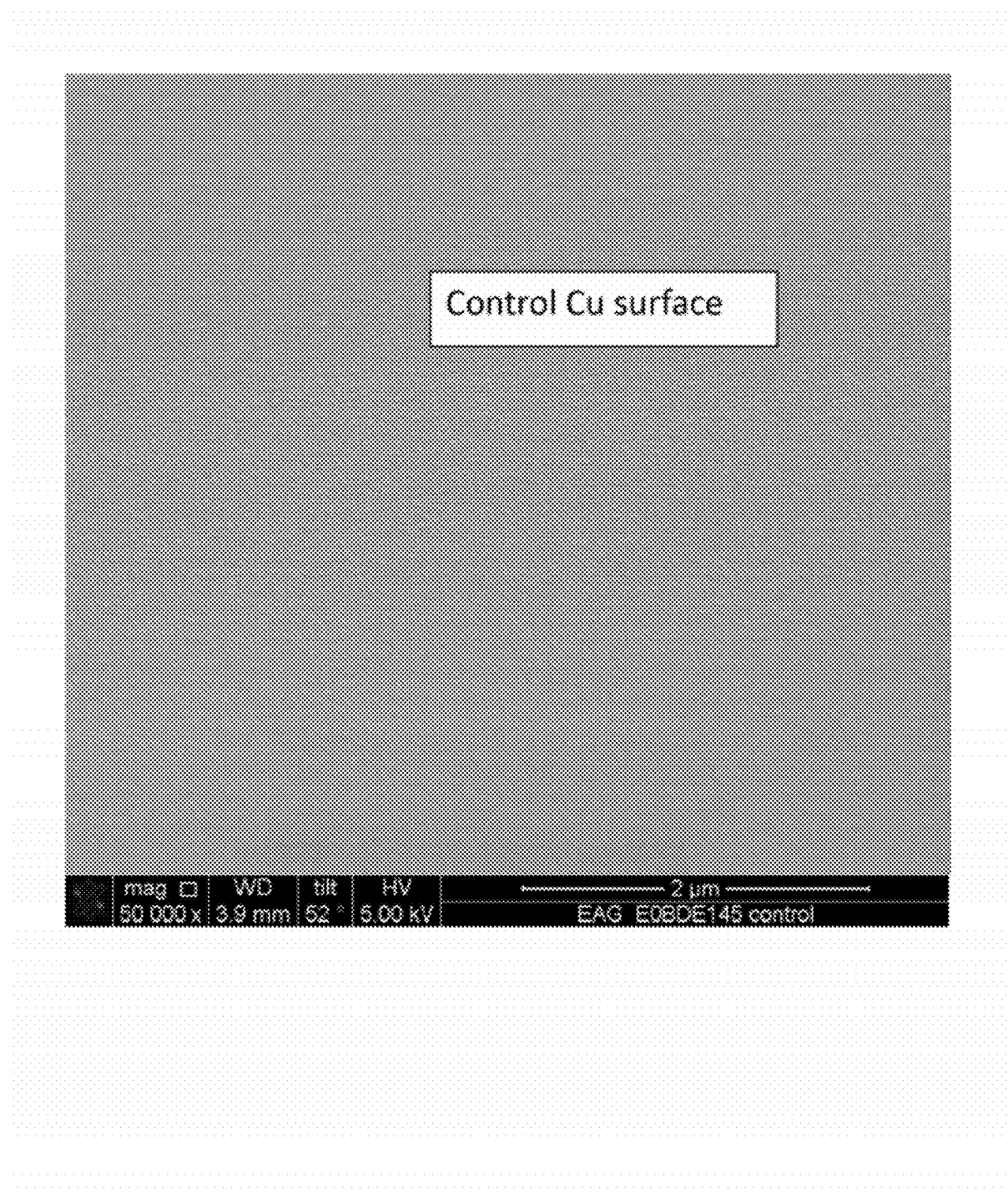
FIGS. 7 and 8 are SEM views of an actual bonding wire fabricated in accordance with aspects of the invention.
Figure 8:
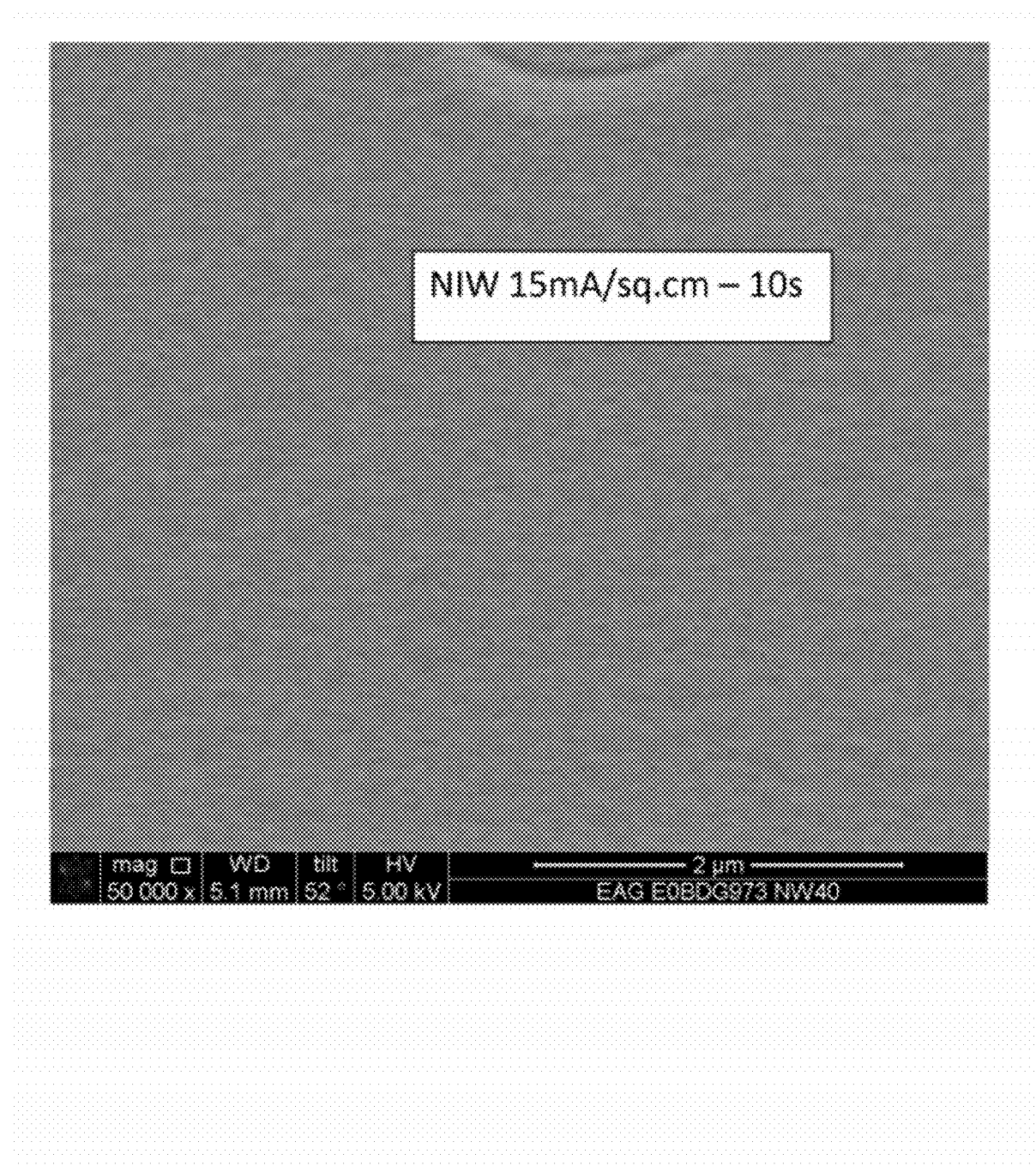

A wire device including a metal core and a cladding layer was prepared in accordance with the methods described above. The exemplary device included a copper core and a cladding formed of nickel-tungsten. The results of the process are shown in FIGS. 7 and 8. The figures show that a wire structure could be obtained with a cladding layer. The figures show that the cladding layer of the exemplary device is denser (signifying a smaller average grain size) than the wire core.

After drawing the wire and applying the cladding layer, the wire structure was tested. The exemplary device was shown to be highly reliable with improved performance characteristics. The cladding layer was found to have a current density of 15 mA/sq.-cm within the interior of the cladding layer at a time of 10 seconds. By comparison to a conventional wire, the exemplary wire structure was found to have about the same resistivity and about 10-20% higher strength. Resistivity was generally within about 5% of normal. In comparison to conventional wires, the exemplary wire structure was found to be less prone to looping and thus easier to wind for shipping and transport.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A wire structure comprising:
   an elongate flexible core formed of a conductor material; and
   a cladding layer covering an outer surface of the core, the cladding layer comprises a conducting material,
   wherein an average grain size of the core material is at least five times greater than an average grain size of the cladding layer material, and the cladding layer has an average grain size between about 2 nm and about 200 nm,
   wherein the cladding layer comprises metal,
   wherein the metal is a member selected from the group consisting of gold, indium, gallium, tin, copper-tungsten, nickel-tungsten, nickel-phosphorus, cobalt-phosphorus, molybdenum-phosphorus, cobalt-tungsten-phosphorus, and combinations of the same, and
   wherein the cladding layer comprises a minor component selected from the group consisting of diamond, silicon carbide, boron nitride, and graphite, the minor component comprising less than 50% of the cladding layer.

2. A wire structure comprising:
an elongate flexible core formed of a conductor material;
a cladding layer covering an outer surface of the core, the cladding layer comprises a conducting material; and
an outer layer covering an outer surface of the cladding layer,
wherein an average grain size of the core material is at least five times greater than an average grain size of the cladding layer material, and the cladding layer has an average grain size between about 2 nm and about 200 nm;
wherein the cladding layer comprises an inner region and an outer region, the inner and outer regions comprising different material compositions; and
wherein the inner region comprises nickel with nano-scale grains and the outer region comprises nickel-tungsten with nano-scale grains.

3. A wire structure comprising:
an elongate flexible core formed of a conductor material; and
a cladding layer covering an outer surface of the core, the cladding layer comprises a conducting material; and
an outer layer covering an outer surface of the cladding layer,
wherein an average grain size of the core material is at least five times greater than an average grain size of the cladding layer material, and the cladding layer has an average grain size between about 2 nm and about 200 nm; and
wherein the outer layer is formed of a metal conductor having an average grain size at least five times greater than the average grain size of the cladding layer material.

4. The wire of claim 3, wherein the outer layer and core are substantially thicker than the cladding layer.

5. The wire of claim 4, wherein the outer layer is thicker than the core.

6. The wire of claim 3, wherein the cladding layer is formed of a nanograin material, and the outer layer and core are formed of micrograin materials.

7. The wire of claim 3, wherein the wire is configured for carrying a high frequency signal.

* * * * *